(12) United States Patent
Zhu et al.

(10) Patent No.: US 10,185,430 B2
(45) Date of Patent: Jan. 22, 2019

(54) TOUCH CONTROL DISPLAY DEVICE AND A PREPARATION METHOD THEREOF

(71) Applicants: Kunshan New Flat Panel Display Technology Center Co., Ltd., Kunshan, Jiangsu (CN); Kunshan Go-Visionox Opto-Electronics Co., Ltd., Kunshan, Jiangsu (CN)

(72) Inventors: Shaopeng Zhu, Jiangsu (CN); Yong Qiu, Jiangsu (CN); Hideo Hirayama, Jiangsu (CN); Xiuqi Huang, Jiangsu (CN)

(*) Notice: Subject to any disclaimer, the term of this patent is extended or adjusted under 35 U.S.C. 154(b) by 0 days.

(21) Appl. No.: 15/107,285

(22) PCT Filed: Dec. 25, 2014

(86) PCT No.: PCT/CN2014/094919
§ 371 (c)(1),
(2) Date: Jun. 22, 2016

(87) PCT Pub. No.: WO2015/096765
PCT Pub. Date: Jul. 2, 2015

(65) Prior Publication Data
US 2017/0003800 A1 Jan. 5, 2017

(30) Foreign Application Priority Data
Dec. 27, 2013 (CN) .......................... 2013 1 0737600

(51) Int. Cl.
*G06F 3/041* (2006.01)
*G06F 3/044* (2006.01)
(Continued)

(52) U.S. Cl.
CPC .......... *G06F 3/0416* (2013.01); *G06F 1/3262* (2013.01); *G06F 3/044* (2013.01);
(Continued)

(58) Field of Classification Search
CPC .... G06F 3/0416; G06F 1/3262; G06F 3/0412; G06F 3/044; G06F 2203/04102;
(Continued)

(56) References Cited

U.S. PATENT DOCUMENTS

2010/0110041 A1 5/2010 Jang
2010/0231490 A1 9/2010 Okano
(Continued)

FOREIGN PATENT DOCUMENTS

CN 101635276 A 1/2010
CN 101894856 A 11/2010
(Continued)

OTHER PUBLICATIONS

International Preliminary Report on Patentability for PCT app No. PCT/CN2014/094919 dated Jun. 28, 2016.
(Continued)

*Primary Examiner* — Rodney Amadiz
(74) *Attorney, Agent, or Firm* — W&K IP

(57) ABSTRACT

As in a touch control display device of the present invention, when second electrodes are formed, the second electrodes are connected in series respectively in the horizontal row direction and in the vertical column direction, so as to form a cross network with rows and columns insulated from one another, namely to form a touch control sensing layer. By integrating a touch control function into organic light-emitting diodes, a compact structure of the device is achieved, there is no need to set up a separate touch control component, the light emitting efficiency is high, and the respond speed is fast. As in a preparation method of the touch control display device of the present invention, second electrodes are formed into such a structure that the second electrodes are connected in series respectively in the horizontal row direction and in the vertical column direction, (Continued)

therefore, when organic light-emitting diodes are prepared, a touch control function can be integrated therein at the same time by means of technically mature photo-etching and etching techniques, which is a simple preparation method with low process cost.

11 Claims, 1 Drawing Sheet

(51) Int. Cl.
 *H01L 27/32* (2006.01)
 *G06F 1/32* (2006.01)
(52) U.S. Cl.
 CPC .......... *G06F 3/0412* (2013.01); *H01L 27/323* (2013.01); *H01L 27/3244* (2013.01); *G06F 2203/04102* (2013.01); *G06F 2203/04103* (2013.01); *G06F 2203/04111* (2013.01); *H01L 27/3276* (2013.01); *H01L 2251/5338* (2013.01)
(58) Field of Classification Search
 CPC . G06F 2203/04103; G06F 2203/04111; H01L 27/3244; H01L 27/323; H01L 27/3276; H01L 2251/5338
 See application file for complete search history.

(56) References Cited

U.S. PATENT DOCUMENTS

| | | | |
|---|---|---|---|
| 2011/0067933 A1 | 3/2011 | Chang et al. | |
| 2013/0147727 A1 | 6/2013 | Lee et al. | |
| 2013/0306946 A1 | 11/2013 | Chang et al. | |
| 2013/0335365 A1 | 12/2013 | Kim et al. | |
| 2014/0293150 A1 | 10/2014 | Tang et al. | |
| 2015/0017457 A1 | 1/2015 | Mizuno et al. | |
| 2015/0194470 A1 | 7/2015 | Hwang | |

FOREIGN PATENT DOCUMENTS

| | | | |
|---|---|---|---|
| CN | 102023739 A | 4/2011 | |
| CN | 102760405 A | 10/2012 | |
| CN | 102855038 A | 1/2013 | |
| CN | 102855044 A | 1/2013 | |
| CN | 202795299 U | 3/2013 | |
| CN | 103197798 A | 7/2013 | |
| CN | 103257743 A | 8/2013 | |
| CN | 203 178979 A | 9/2013 | |
| CN | 203178979 U | 9/2013 | |
| JP | 2009-053894 A | 3/2009 | |
| JP | 2010-20315 A | 1/2010 | |
| JP | 2010-231773 A | 10/2010 | |
| JP | 2013-122752 A | 6/2013 | |
| JP | 2013-214507 A | 10/2013 | |
| JP | 2013-224977 A | 10/2013 | |
| JP | 2013-257898 A | 12/2013 | |
| TW | 201219902 A1 | 5/2012 | |
| TW | 201220923 A1 | 5/2012 | |
| TW | 201305866 A1 | 2/2013 | |
| TW | 201333764 A1 | 8/2013 | |
| TW | 201346998 A | 11/2013 | |
| TW | 201351446 A | 12/2013 | |
| WO | WO 2014/126661 A1 | 8/2014 | |

OTHER PUBLICATIONS

Supplemental European Search Report for EP app No. 14 87 4008 dated Dec. 5, 2016.
TW Office Action of TW103145788 dated Mar. 16, 2018.
JP Office Action of JP2016-559490 dated Jun. 27, 2017.

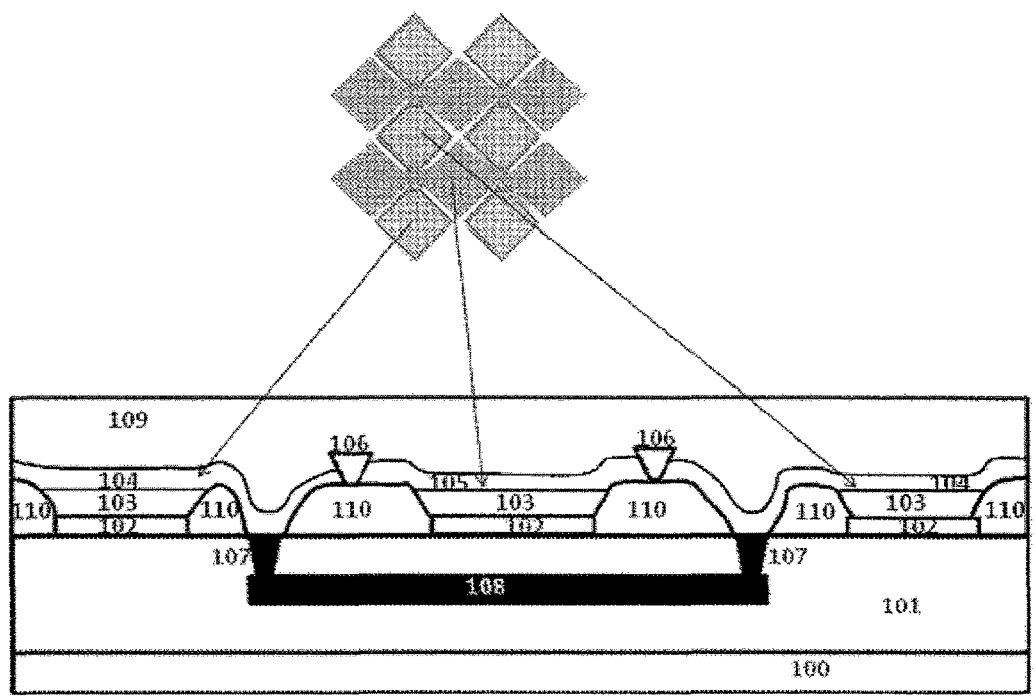

TOUCH CONTROL DISPLAY DEVICE AND A PREPARATION METHOD THEREOF

TECHNICAL FIELD

The present invention relates to the field of display technology, and in particular relates to an organic light-emitting display device with embedded touch control structure as well as a preparation method thereof.

BACKGROUND OF THE INVENTION

Touch Panel, also known as Touch Screen or Touch Control Panel, is an induction type display device that is able to receive input signal from a contactor or the like, and it is widely used in various electronic products. According to different operation principles and information transmitting media, there are four types of Touch Panels: resistance type, capacitive type, infrared ray type, and surface sound wave type.

Capacitive Touch Panel (abbreviated as CTP) controls the screen by utilizing electric current induction of a human body. On the basis of detected change of electric capacity of the contacted area, the location of the contacting finger is calculated with accuracy up to 99% and respond time less than 3 ms. Since CTP has advantages such as high sensitivity and easily achievable multi-point touch control, CTP gradually becomes a mainstream Touch Panel applied in electronic products such as smart-phones and tablet computers.

In prior art, according to the relative position between the touch control stacked layer structure and the display panel, CTP can be divided into different technical architectures of out-cell (the touch control device is hanging out of the display panel), on-cell (the touch control device is configured on the display panel), and in-cell (the touch control device is integrated within the display panel). Although the out-cell technology and the on-cell technology are mature and have been widely used along with medium and small sized display panel, and OFS (One Film Solution) of the out-cell technology can be used in an organic electro-luminescent display device to make it possible for flexible touch control display, however, the in-cell technology can make the display panel lighter and thinner, with higher light transmittance and lower power consumption, as well as achievable flexibility, and therefore the in-cell technology is considered to be an ultimate solution for touch control display, especially for touch control of organic electro-luminescent display, which will gradually become a development mainstream of touch control technology in organic electro-luminescent display devices.

Chinese patent literature CN101635276A discloses an organic light-emitting diode touch control panel which comprises a substrate, an OLED component, and a light sensing component. At least one pixel area is defined on the substrate, and a display area and a sensing area are defined in the pixel area. The OLED component is configured in the display area on the substrate and comprises a first thin film transistor, a light-emitting lower electrode part, a patterned organic light-emitting layer, and a light-emitting upper electrode part. The light-emitting lower electrode part is configured on the substrate and electrically connected to the first thin film transistor. The patterned organic light-emitting layer is configured on the light-emitting lower electrode part. The light-emitting upper electrode is configured on the patterned organic light-emitting layer. The light sensing component is configured in the sensing area on the substrate and comprises a second thin film transistor, a light sensing lower electrode part, a patterned light sensing dielectric layer, and a light sensing upper electrode part. The light sensing lower electrode part is configured on the second thin film transistor and electrically connected to the second thin film transistor. The patterned light sensing dielectric layer is configured on the light sensing lower electrode part, and the light sensing upper electrode part is configured on the patterned light sensing dielectric layer. The product of this patent has high sensitivity, but pertains to an in-cell type light touch control device which not only has complicated structure and preparation process but also is difficult to achieve multi-point touch control, so that it does not belong to mainstream touch control technology.

SUMMARY OF THE INVENTION

Thus, the present invention is to solve a technical problem that the in-cell type touch control technology in prior art has complicated structure and preparation process, and an objective of the present invention is to provide an organic light-emitting display device with embedded touch control structure and its preparation method that have simple structure and process.

In order to solve the above-mentioned technical problem, the present invention provides the following technical solutions:

A touch control display device of the present invention comprises a substrate, and a plurality of organic light-emitting diodes arranged on the substrate, each of which including a first electrode, an organic material layer and a second electrode stacked in sequence, wherein, the first electrodes are separately arranged, the second electrodes are respectively connected in series to form a plurality of first conductive stripes arranged in parallel and a plurality of second conductive stripes arranged in parallel, and the first conductive stripes and the second conductive stripes are configured to be insulated from each other and to form a cross network.

Preferably, the first conductive stripes are formed by the second electrodes arranged along a first direction and connected in series in the same layer, the second conductive stripes are formed by the second electrodes arranged along a second direction and connected in series through conductive bridges outside the organic light-emitting diodes.

Preferably, the conductive bridges are arranged on the substrate and are insulated from the organic light-emitting diode by an insulation layer covered directly upon the conductive bridges.

Preferably, the conductive bridges are metal bridges.

Preferably, the conductive bridges each have a thickness of 10 nm-1000 nm.

Preferably, a pixel defining layer for separating adjacent organic light-emitting diodes is provided on the substrate.

Preferably, a separating pillar layer for separating adjacent stripes of the first conductive stripes and the second conductive stripes is provided directly upon the pixel limiting layer.

Preferably, the second electrodes have a thickness of 1 nm-500 nm.

Preferably, the touch control display device further comprises a plurality of drive thin film transistors arranged on the substrate, each of the first electrodes is connected to a source electrode or a drain electrode of one of the drive thin film transistors.

A preparation method of the touch control display device in accordance with the present invention comprises the following steps:

S1, forming a first conductive layer on the substrate, and this first conductive layer is patterned into a plurality of conductive bridges arranged in parallel in a second direction;

S2, forming an insulation layer on the substrate, wherein, the insulation layer is arranged to cover the conductive bridges and has through holes provided therein for forming conductive connections with the conductive bridges;

S3, forming first electrodes directly upon the insulation layer which are arranged to be separated from one another, and forming an organic material layer on each of the first electrodes;

S4, forming second electrodes on the organic material layer, wherein the second electrodes arranged along a first direction are connected in series in the same layer so as to form a plurality of first conductive stripes in parallel, and the second electrodes arranged along the second direction are connected in series by means of the conductive bridges and the through holes so as to form a plurality of second conductive stripes in parallel, the first conductive stripes and the second conductive stripes form a cross-over network while being insulated from each other.

Preferably, in the step S3, after forming the first electrodes, the method further comprises forming a pixel limiting layer that surrounds the first electrodes on the substrate.

Preferably, in the step S3, the method further comprises forming a separating pillar layer directly upon the pixel limiting layer; and adjacent stripes of the first conductive stripes and the second conductive stripes formed in the step S4 are separated by the separating pillar layer.

Preferably, in the step S2, an intersection angle between the axial direction of the through hole and the substrate is 10°-90°.

Compared to prior art, the aforementioned technical solutions of the present invention have the following advantages:

1. The touch control display device of the present invention comprises a substrate and a plurality of organic light-emitting diodes arranged on the substrate, the first electrodes thereof are separately arranged, the second electrodes thereof are respectively connected in series to form a plurality of first conductive stripes arranged in parallel and a plurality of second conductive stripes arranged in parallel, and the first conductive stripes and the second conductive stripes are configured to be insulated from each other and to form a cross network. When the second electrodes are formed, the second electrodes are connected in series respectively in the horizontal row direction and in the vertical column direction, so as to form a cross network with rows and columns insulated from one another, namely to form a touch control sensing layer. By integrating a touch control function into the second electrodes of the organic light-emitting diodes, a compact structure of the device is achieved, with achievable multi-point touch control.

2. In the touch control display device of the present invention, because the touch control function is integrated into the organic light-emitting diodes, there is no need to set up a separate touch control component, the light emitting efficiency is high, and the respond speed is fast.

3. In the preparation method of the touch control display device of the present invention, the second electrodes are formed into such a structure that the second electrodes are connected in series respectively in the horizontal row direction and in the vertical column direction, therefore, when the organic light-emitting diodes are prepared, a touch control function can be integrated therein at the same time by means of technically mature photo-etching and etching techniques, which is a simple preparation method with low process cost.

BRIEF DESCRIPTION OF THE DRAWINGS

In order to make the subject matter of the present invention easy and clear to understand, hereinafter, the present invention will be further described in detail according to specific embodiments of the present invention and with reference to the appended drawings, wherein:

FIG. 1 is a structural schematic diagram of a touch control display device in accordance with Embodiment 1 of the present invention.

The reference numerals in the drawing are explained as follows: 100—substrate, 101—insulation layer, 102—first electrode, 103—organic material layer, 104—second electrode in the second conductive stripe, 105—second electrode in the first conductive stripe, 106—separating pillar layer, 107—through hole, 108—conductive bridge, 109—encapsulation layer, 110—pixel defining layer.

DETAILED DESCRIPTION OF EMBODIMENTS

In order to more clearly illustrate the purpose, technical solution and advantages of the present invention, hereinafter, specific embodiments of the present invention will be further described in detail with reference to the appended drawings.

The present invention can be implemented in many different forms, and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is defined by the Claims. In the appended drawings, for the sake of clarity, dimensions and relative sizes of layers and areas might be exaggerated. It should be understood that, when one element such as a layer, an area or a substrate plate is described as "formed on" or "configured on" another element, this one element may be configured directly upon that another element, or there may exist intermediate element(s). On the contrary, when one element is described as "directly formed upon" or "directly configured upon" another element, there exist no intermediate element.

The present embodiment provides a touch control display device, as shown in FIG. 1, which comprises a substrate 100 and organic light-emitting diodes arranged on the substrate 100. The first electrodes 102 of the organic light-emitting diodes are separately arranged. The second electrodes 104 and 105 are respectively connected in series to form a plurality of first conductive stripes arranged in parallel and a plurality of second conductive stripes arranged in parallel, and the first conductive stripes and the second conductive stripes are configured to be insulated from each other and to form a cross network.

The first conductive stripes are formed by the second electrodes 105 arranged along a first direction and connected in series in the same layer. The second conductive stripes are formed by the second electrodes 104 arranged along a second direction and connected in series through conductive bridges outside the organic light-emitting diodes.

The conductive bridges 108 are arranged in an insulation layer 101 between the substrate 100 and the organic light-emitting diodes. The conductive bridge 108 is selected from but not limited to single-layered or multi-layered conductive polymer or metal such as Molybdenum, Aluminum, Titanium, Tungsten or their alloy thin film, preferably is a multi-layered metal conductive bridge, and more preferably in this embodiment is a three-layered metal film of Molybdenum/Aluminum/Molybdenum stacked in sequence.

The Molybdenum/Aluminum/Molybdenum in the conductive bridge 108 of this embodiment is respectively 50 nm/250 nm/50 nm. As in other embodiments of the present invention, the conductive bridge 108 may also has a thickness of 10 nm-1000 nm, which can also achieve the purpose of the present invention and are also within the protection scope of the present invention.

The insulation layer 101 is selected from but not limited to silicon nitride, silicon oxide, silicon oxy-nitride, aluminum oxide formed as a single-layered or multi-layered stacked structure, and preferably in this embodiment is a single-layered silicon nitride layer.

The first electrode 102, the organic material layer 103, and the second electrode have the same material and thickness as prior art, wherein the thickness of the second electrode is preferably 1 nm-500 nm. In this embodiment, the first electrode 102 is a layer formed by ITO/Ag/ITO stacked in sequence, with a thickness of 15 nm/110 nm/7 nm. The organic material layer 103 includes a light-emitting layer together with one or more selected from a hole injection layer, a hole transport layer, an electron blocking layer, a hole blocking layer, an electron transport layer and an electron injection layer, and, in this embodiment, the organic material layer 103 includes a hole transport layer, a light-emitting layer and an electron transport layer stacked in sequence with a total thickness of 200 nm. The second electrode is Ag with a thickness of 5 nm.

A pixel limiting layer 110 for separating adjacent diodes of the organic light-emitting diodes is also provided on the substrate 100, and a separating pillar layer 106 for separating adjacent stripes of the first conductive stripes and the second conductive stripes is also provided directly upon the pixel limiting layer 110.

In the present embodiment, the separating pillar 106 that separates the second electrodes into the first conductive stripes and the second conductive stripes is preferably a polyimide layer with a height of 0.1 µm-5 µm, more preferably being 1 µm in this embodiment, and with a width of 1 µm. As in other embodiments of the present invention, the separating pillar 106 may also be made from other insulation material, or there may be no such separating pillar 106 provided between the second electrodes as long as the first conductive stripes and the second conductive stripes are kept insulated from each other, these arrangements can also achieve the purpose of the present invention and are also within the protection scope of the present invention.

The touch control display device of the present embodiment is an active-matrix organic light-emitting display device which also comprises a plurality of drive thin film transistors arranged on the substrate 100, and each of the first electrodes 102 is connected to a source electrode or a drain electrode of one of the drive thin film transistors.

The touch control display device of the present embodiment is a top-emitting organic light-emitting display device, wherein the second electrodes are transparent electrodes.

In the present embodiment, an encapsulation layer 109 is also provided on the second electrodes 104 and 105. The encapsulation layer 109 comprises a single layer of or alternately arranged multiple layers of organic thin film(s) and/or inorganic thin film(s), wherein the inorganic thin film is selected from but not limited to silicon nitride thin film, silicon oxide thin film, etc., and the organic thin film is selected from but not limited to ultraviolet ray curable resin thin film, silicon dioxide-acrylic resin composite material thin film, etc. In this embodiment, the encapsulation layer 109 is preferably formed by deposition of alternately arranged four pairs of polyacrylic ester layers and aluminum oxide layers, wherein each of the polyacrylic ester layers has a thickness of 1.5 µm and each of the aluminum oxide layers has a thickness of 50 nm.

In the touch control display device of the present embodiment, the second electrodes are configured to be connected in series respectively in the horizontal row direction and in the vertical column direction, so as to form a cross network with rows and columns insulated from one another, therefore, when forming the second electrodes, a touch control sensing layer is formed at the same time, so that a touch control function is integrated into the organic light-emitting diodes, and as a result, there is no need to set up a separate touch control component, the light emitting efficiency is high, and the respond speed is fast.

The preparation method of the touch control display device comprises the following steps:

S1, by means of sputtering technique, forming a first conductive layer on the substrate 100, and this first conductive layer is patterned into a plurality of continuous conductive bands arranged in parallel in the vertical column direction, i.e. forming conductive bridges 108.

As in other embodiments of the present invention, the first conductive layer may also be patterned into wire-shaped conductive bridges 108, or, the conductive wires or conductive bands may also be discontinuous.

S2, by means of Plasma Enhanced Chemical Vapor Deposition (PECVD) technique, forming an insulation layer 101 that covers the conductive bridges 108, and then, by means of photo-etching technique, forming through holes 107 that act as conductive channels connected to the same conductive bridge 108 in the insulation layer 101 between adjacent second organic light-emitting diodes in the same column. An intersection angle between the axial direction of the through hole 107 and the substrate 100 is 50°. As in other embodiments of the present invention, the through holes may also be prepared by laser ablation, ion beam etching, electron beam etching, etc., and the intersection angle between the axial direction of the through hole 107 and the substrate 100 may also be any angle between 10° and 90°, these arrangements can also achieve the purpose of the present invention and are also within the protection scope of the present invention.

S3, by means of sputtering technique, forming a second conductive layer directly upon the insulation layer 101, and then, by means of photo-etching and etching techniques, the second conductive layer is patterned into first electrodes 102 that are separated from one another.

As in other embodiments of the present invention, the second conductive layer may also be prepared by CVD, electrochemical deposition, etc., which can also achieve the purpose of the present invention and are also within the protection scope of the present invention.

By means of coating technique, forming a pixel limiting layer 110 that covers the first electrodes 102, and then, by means of photo-etching patterning, the first electrodes 102 as well as the through holes 107 are exposed.

Then, by means of coating and photo-etching techniques, a separating pillar layer 106 is formed upon the pixel limiting layer 110.

Then, by means of fine mask evaporation coating technique, an organic material layer 103 is formed on each of the first electrodes 102.

S4, by means of evaporation coating technique, and by using the separating pillar layer 106 as a mask, forming second electrodes 105 that are arranged along a first direction and connected in series in the same layer on the organic material layer 103, and also forming second electrodes 104 that are arranged along a second direction and separated from one another on the organic light-emitting diodes 103, wherein the second electrodes 104 and the second electrodes 105 are separated naturally by the separating pillar layer 106 with a negative extending angle. The second electrodes 105 are connected in series to form first conductive stripes. The material that forms the second electrodes are filled in the through holes 107 and conductively connected to the conductive bridges 108 by electrical contact, thereby connecting the second electrodes 104 in series along the second direction so as to form second conductive stripes.

In the present embodiment, after the step S4, the method further comprises a step of forming an encapsulation layer 109 that covers the second electrodes 104 and 105 on the substrate 100, and its detailed implementation way is the same as prior art.

In the preparation method of the touch control display device of the present embodiment, the second electrodes are prepared into such a structure that the second electrodes are connected in series respectively in the horizontal row direction and in the vertical column direction, therefore, when finishing preparation of the organic light-emitting diodes, a touch control function can be integrated therein at the same time by means of technically mature photo-etching technique, which is a simple preparation method with low process cost.

Apparently, the aforementioned embodiments are merely examples illustrated for clearly describing the present invention, rather than limiting the implementation ways thereof. For those skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. A touch control display device, comprising
a substrate, and
a plurality of organic light-emitting diodes arranged on the substrate, each of which including a first electrode, an organic material layer and a second electrode stacked in sequence;
characterized in that,
the first electrodes are arranged to be separated from each other, the second electrodes are respectively connected in series to form a plurality of first conductive stripes arranged in parallel and a plurality of second conductive stripes arranged in parallel, and the first conductive stripes and the second conductive stripes are configured to be insulated from each other and to form a cross network which constitutes a touch control structure,
the first conductive stripes are formed by the second electrodes arranged along a first direction and connected in series in the same layer,
the second conductive stripes are formed by the second electrodes arranged along a second direction and connected in series through conductive bridges outside the organic light-emitting diodes, wherein, the conductive bridges are arranged on the substrate and are insulated from the organic light-emitting diodes by an insulation layer covered directly upon the conductive bridges, and the second electrodes forming each of the second conductive stripes are connected to the conductive bridges directly via through holes formed in the insulation layer.

2. The touch control display device in accordance with claim 1, characterized in that, the conductive bridges are metal bridges.

3. The touch control display device in accordance with claim 1, characterized in that, the conductive bridges each have a thickness of 10 nm-1000 nm.

4. The touch control display device in accordance with claim 1, characterized in that, a pixel defining layer for separating adjacent organic light-emitting diodes is provided on the substrate.

5. The touch control display device in accordance with claim 4, characterized in that, a separating pillar layer for separating adjacent stripes of the first conductive stripes and the second conductive stripes is provided directly upon the pixel limiting layer.

6. The touch control display device in accordance with claim 1, characterized in that, the second electrodes have a thickness of 1 nm-500 nm.

7. The touch control display device in accordance with claim 1, characterized in further comprising a plurality of drive thin film transistors arranged on the substrate, each of the first electrodes is connected to a source electrode or a drain electrode of one of the drive thin film transistors.

8. A preparation method of the touch control display device in accordance with claim 1, characterized in comprising the following steps:
S1, forming a first conductive layer on the substrate, and this first conductive layer is patterned into a plurality of conductive bridges arranged in parallel in a second direction;
S2, forming an insulation layer on the substrate, wherein, the insulation layer is arranged to cover the conductive bridges and has through holes provided therein for forming conductive connections with the conductive bridges;
S3, forming first electrodes directly upon the insulation layer which are arranged to be separated from one another, and forming an organic material layer on each of the first electrodes;
S4, forming second electrodes on the organic material layer, wherein the second electrodes arranged along a first direction are connected in series in the same layer so as to form a plurality of first conductive stripes in parallel, and the second electrodes arranged along the second direction are connected in series by being connected to the conductive bridges directly via the through holes so as to form a plurality of second conductive stripes in parallel, the first conductive stripes and the second conductive stripes are insulated from each other and form a cross network which constitutes a touch control structure.

9. The preparation method in accordance with claim 8, characterized in that, in the step S3, after forming the first electrodes, the method further comprises forming a pixel limiting layer that surrounds the first electrodes on the substrate.

10. The preparation method in accordance with claim 9, characterized in that, in the step S3, the method further comprises forming a separating pillar layer directly upon the pixel limiting layer; and adjacent stripes of the first conductive stripes and the second conductive stripes formed in the step S4 are separated by the separating pillar layer.

11. The preparation method in accordance with claim 8, characterized in that, in the step S2, an intersection angle between the axial direction of the through hole and the substrate is 10°-90°.

* * * * *